(12) United States Patent  
Cheng

(10) Patent No.: US 10,756,749 B1  
(45) Date of Patent: Aug. 25, 2020

(54) DIGITAL TO ANALOG CONVERSION DEVICE AND DIGITAL TO ANALOG CONVERSION CIRCUIT THEREOF

(71) Applicant: NOVATEK MICROELECTRONICS CORP., Hsinchu Science Park, Hsinchu County (TW)

(72) Inventor: Yen-Cheng Cheng, Zhubei (TW)

(73) Assignee: NOVATEK MICROELECTRONICS CORP., Hsinchu Science Park (TW)

( * ) Notice: Subject to any disclaimer, the term of this patent is extended or adjusted under 35 U.S.C. 154(b) by 0 days.

(21) Appl. No.: 16/746,713

(22) Filed: Jan. 17, 2020

(51) Int. Cl.  
*H03M 1/66* (2006.01)  
*H03M 3/00* (2006.01)

(52) U.S. Cl.  
CPC .............. *H03M 1/66* (2013.01); *H03M 3/372* (2013.01); *H03M 3/464* (2013.01)

(58) Field of Classification Search  
CPC ......... H03M 1/66; H03M 3/372; H03M 3/464  
USPC ........................................................ 341/144  
See application file for complete search history.

(56) References Cited

U.S. PATENT DOCUMENTS

| | | | | |
|---|---|---|---|---|
| 3,984,830 A | * | 10/1976 | Buchanan ............... | H03M 1/74 341/136 |
| 4,267,550 A | * | 5/1981 | Cecil ..................... | H03M 1/785 341/118 |

* cited by examiner

*Primary Examiner* — Brian K Young  
(74) *Attorney, Agent, or Firm* — Hamre, Schumann, Mueller & Larson, P.C.

(57) ABSTRACT

A DAC device includes a first DAC circuit and a second DAC circuit. The first DAC circuit includes multiple DAC portions, each of which includes multiple pMOSFETs. The second DAC circuit includes multiple DAC portions, each of which includes multiple nMOSFETs. For each of the first and second DAC circuits, bulk terminals of at least some of the MOSFETs of each DAC portion are for receiving a respective one of bulk voltages with different magnitudes, a gate terminal of each of the MOSFETs of the DAC portions is for receiving a gate signal, and voltage magnitudes of at least some of the gate signals received by each DAC portion switch between a respective one of different logic high levels and a respective one of different logic low levels.

18 Claims, 11 Drawing Sheets

US 10,756,749 B1

DIGITAL TO ANALOG CONVERSION DEVICE AND DIGITAL TO ANALOG CONVERSION CIRCUIT THEREOF

FIELD

The disclosure relates to digital to analog conversion, and more particularly to a digital to analog conversion device and a digital to analog conversion circuit thereof.

BACKGROUND

A conventional digital to analog conversion (DAC) circuit includes a plurality of P-type metal oxide semiconductor field effect transistors (pMOSFETs) and a plurality of N-type metal oxide semiconductor field effect transistors (nMOSFETs), and has the following disadvantages.

1. The total number of the pMOSFETs is equal to the total number of the nMOSFETs. Therefore, the conventional DAC circuit uses a large number of MOSFETs, and occupies a large area.

2. All of the bulk terminals of the pMOSFETs receive the most positive voltage, and all of the bulk terminals of the nMOSFETs receive the most negative voltage. Therefore, most of the pMOSFETs and most of the nMOSFETs have significant body effects and large ON resistances.

3. For each of the pMOSFETs and the nMOSFETs, when the MOSFET is to transmit a voltage with a magnitude that is approximately the voltage magnitude of the signal received at its gate terminal, it is hard for the MOSFET to conduct.

SUMMARY

Therefore, an object of the disclosure is to provide a digital to analog conversion device, and a digital to analog conversion circuit thereof that can alleviate the drawbacks of the prior art.

According to the disclosure, the digital to analog conversion (DAC) device is adapted to receive a plurality of first input voltages that are within a first voltage range and a plurality of second input voltages that are within a second voltage range lower than the first voltage range, to output one of the first input voltages that corresponds to a value represented by a digital input signal to serve as a first output voltage, and to output one of the second input voltages that corresponds to the value represented by the digital input signal to serve as a second output voltage. The DAC device includes a first DAC circuit and a second DAC circuit. The first DAC circuit includes a plurality of first DAC portions, each of which is for receiving at least one of the first input voltages, and which cooperatively output at least one of the first input voltages. The second DAC circuit includes a plurality of second DAC portions, each of which is for receiving at least one of the second input voltages, and which cooperatively output at least one of the second input voltages. Each of the first DAC portions includes a plurality of P-type metal oxide semiconductor field effect transistors (pMOSFETs), each of which has a bulk terminal and a gate terminal. The bulk terminals of at least some of the pMOSFETs of each of the first DAC portions are for receiving a respective one of a plurality of first bulk voltages with different magnitudes. The gate terminal of each of the pMOSFETs of said first DAC portions is for receiving a gate signal. Voltage magnitudes of at least some of the gate signals received by each of the first DAC portions switch between a respective one of a plurality of different first logic high levels and a respective one of a plurality of different first logic low levels. Each of the second DAC portions includes a plurality of N-type metal oxide semiconductor field effect transistors (nMOSFETs), each of which has a bulk terminal and a gate terminal. The bulk terminals of at least some of the nMOSFETs of each of the second DAC portions are for receiving a respective one of a plurality of second bulk voltages with different magnitudes. The gate terminal of each of the nMOSFETs of the second DAC portions is for receiving a gate signal. Voltage magnitudes of at least some of the gate signals received by each of the second DAC portions switch between a respective one of a plurality of different second logic high levels and a respective one of a plurality of different second logic low levels.

According to an aspect of the disclosure, the digital to analog conversion (DAC) circuit is adapted to receive a plurality of input voltages that are within a voltage range, and to output one of the input voltages that corresponds to a value represented by a digital input signal to serve as an output voltage. The DAC circuit includes a plurality of DAC portions, each of which is for receiving at least one of the input voltages, and which cooperatively output at least one of the input voltages. Each of the DAC portions includes a plurality of P-type metal oxide semiconductor field effect transistors (pMOSFETs), each of which has a bulk terminal and a gate terminal. The bulk terminals of at least some of the pMOSFETs of each of the DAC portions are for receiving a respective one of a plurality of bulk voltages with different magnitudes. The gate terminal of each of the pMOSFETs of the DAC portions is for receiving a gate signal. Voltage magnitudes of at least some of the gate signals received by each of the DAC portions switch between a respective one of a plurality of different logic high levels and a respective one of a plurality of different logic low levels.

According to another aspect of the disclosure, the digital to analog conversion (DAC) circuit is adapted to receive a plurality of input voltages that are within a voltage range, and to output one of the input voltages that corresponds to a value represented by a digital input signal to serve as an output voltage. The DAC circuit includes a plurality of DAC portions, each of which is for receiving at least one of the input voltages, and which cooperatively output at least one of the input voltages. Each of the DAC portions includes a plurality of N-type metal oxide semiconductor field effect transistors (nMOSFETs), each of which has a bulk terminal and a gate terminal. The bulk terminals of at least some of the nMOSFETs of each of the DAC portions are for receiving a respective one of a plurality of bulk voltages with different magnitudes. The gate terminal of each of the nMOSFETs of the DAC portions is for receiving a gate signal. Voltage magnitudes of at least some of the gate signals received by each of the DAC portions switch between a respective one of a plurality of different logic high levels and a respective one of a plurality of different logic low levels.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
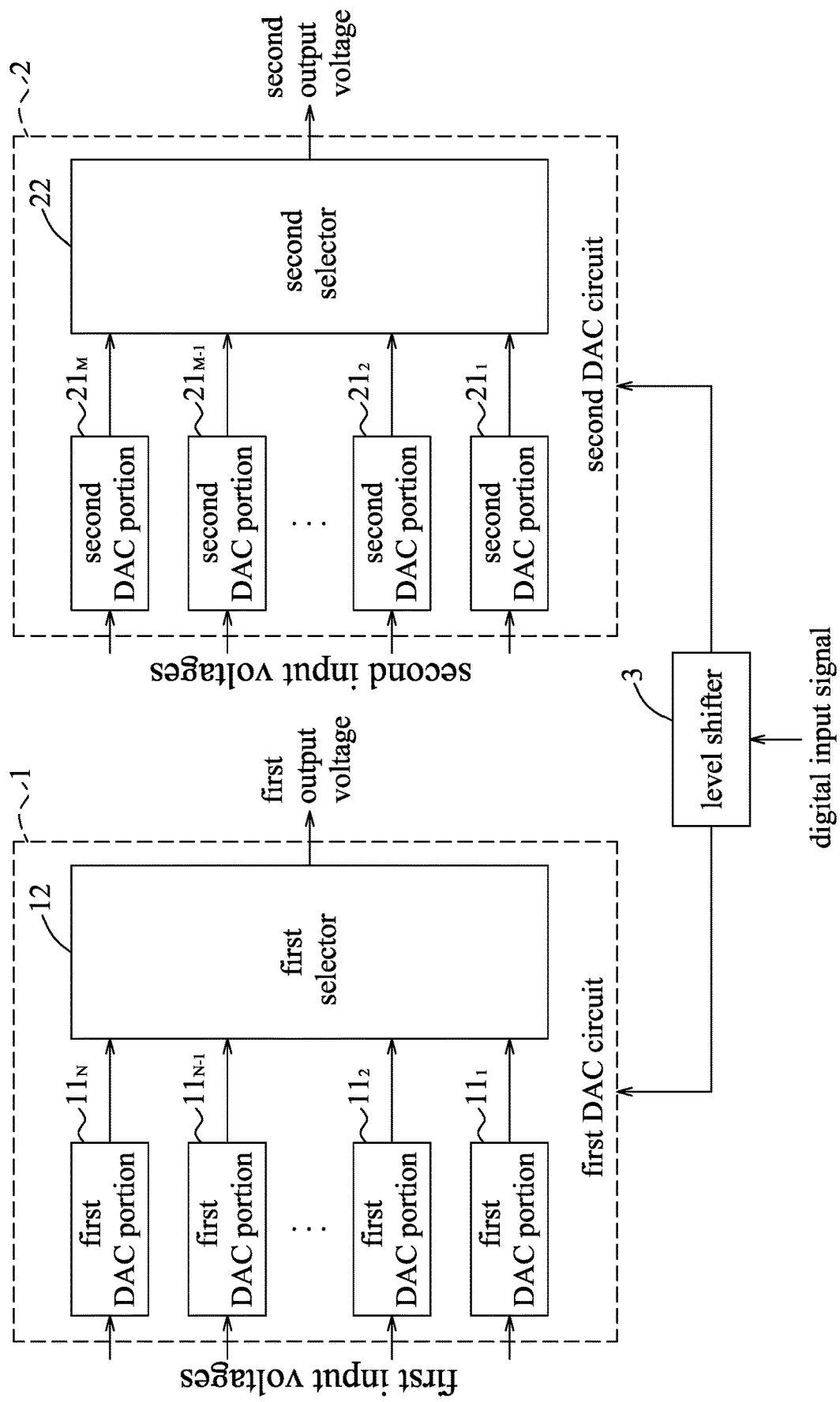
FIG. 1 is a block diagram illustrating a first embodiment of a digital to analog conversion (DAC) device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a digital to analog conversion (DAC) device according to the disclosure is adapted to receive a plurality of first input voltages that are within a first voltage range and a plurality of second input voltages that are within a second voltage range lower than the first voltage range, to output one of the first input voltages that corresponds to a value represented by a digital input signal to serve as a first output voltage, and to output one of the second input voltages that corresponds to the value represented by the digital input signal to serve as a second output voltage. The DAC device of this embodiment includes a first DAC circuit 1, a second DAC circuit 2 and a level shifter 3.

In this embodiment, the first DAC circuit 1 includes a number (N) of first DAC portions ($11_1$-$11_N$), where N≥2. The first DAC circuit 1 can further include a first selector 12. The first DAC portions ($11_1$-$11_N$) respectively correspond to a number (N) of consecutive first voltage sub-ranges that cooperatively constitute the first voltage range. Each of the first DAC portions ($11_1$-$11_N$) is for receiving at least one of the first input voltages that is within a corresponding one of the first voltage sub-ranges, and outputs one of the at least one first input voltage received thereby. The first selector 12 is coupled to the first DAC portions ($11_1$-$11_N$) for receiving the first input voltages respectively outputted by the first DAC portions ($11_1$-$11_N$), and outputs one of the first input voltages received thereby to serve as the first output voltage.

In particular, the first voltage range is from $VA_1$ to $VA_{N+1}$, and the first voltage sub-ranges are respectively from $VA_1$ to $VA_2$, from $VA_2$ to $VA_3$, ..., and from $VA_N$ to $VA_{N+1}$, where $VA_1<VA_2<\ldots<VA_{N+1}$. An $n^{th}$ one of the first DAC portions ($11_n$) corresponds to an $n^{th}$ one of the first voltage sub-ranges that is from $VA_n$ to $VA_{n+1}$, and is for receiving at least one of the first input voltages that is within the $n^{th}$ one of the first voltage sub-ranges, where 1≤n≤N.

In this embodiment, the second DAC circuit 2 includes a number (M) of second DAC portions ($21_1$-$21_M$), where M≥2. The second DAC circuit 2 can further include a second selector 22. The second DAC portions ($21_1$-$21_M$) respectively correspond to a number (M) of consecutive second voltage sub-ranges that cooperatively constitute the second voltage range. Each of the second DAC portions ($21_1$-$21_M$) is for receiving at least one of the second input voltages that is within a corresponding one of the second voltage sub-ranges, and outputs one of the at least one second input voltage received thereby. The second selector 22 is coupled to the second DAC portions ($21_1$-$21_M$) for receiving the second input voltages respectively outputted by the second DAC portions ($21_1$-$21_M$), and outputs one of the second input voltages received thereby to serve as the second output voltage.

In particular, the second voltage range is from $VB_1$ to $VB_{M+1}$, and the second voltage sub-ranges are respectively from $VB_1$ to $VB_2$, from $VB_2$ to $VB_3$, ..., and from $VB_M$ to $VB_{M+1}$, where $VB_1<VB_2<\ldots<VB_{M+1}$. The second voltage range is consecutive to the first voltage range (i.e., $VB_{M+1}=VA_1$). An $m^{th}$ one of the second DAC portions ($21_m$) corresponds to an $m^{th}$ one of the second voltage sub-ranges that is from $VB_m$ to $VB_{m+1}$, and is for receiving at least one of the second input voltages that is within the $m^{th}$ one of the second voltage sub-ranges, where 1≤m≤M.

In this embodiment, each of the first DAC portions ($11_1$-$11_N$) includes a plurality of P-type metal oxide semiconductor field effect transistors (pMOSFETs) (not shown), each of which has a bulk terminal and a gate terminal. The bulk terminals of the pMOSFETs of each of the first DAC portions ($11_1$-$11_N$) are for receiving a respective one of a plurality of first bulk voltages with different magnitudes. The gate terminal of each of the pMOSFETs of the first DAC portions ($11_1$-$11_N$) is for receiving a gate signal. Voltage magnitudes of the gate signals received by each of the first DAC portions ($11_1$-$11_N$) switch between a respective one of a plurality of different first logic high levels and a respective one of a plurality of different first logic low levels.

In particular, as shown in Table 1 below, for the $n^{th}$ one of the first DAC portions ($11_n$), the magnitude of the respective one of the first bulk voltages is greater than or equal to a maximum of magnitude(s) of the at least one first input voltage received by the first DAC portion ($11_n$), and is smaller than or equal to an upper limit of the corresponding one of the first voltage sub-ranges (i.e., $VA_{n+1}$); the respective one of the first logic high levels is equal to the upper limit of the corresponding one of the first voltage sub-ranges (i.e., $VA_{n+1}$); and the respective one of the first logic low levels is smaller than a lower limit of the corresponding one of the first voltage sub-ranges (i.e., $VA_n$), where 1≤n≤N. In an example, for the $N^{th}$ one of the first DAC portions ($11_N$), the magnitude of the respective one of the first bulk voltages is equal to the maximum of the magnitude(s) of the at least one first input voltage received by the first DAC portion ($11_N$), and the respective one of the first logic low levels is equal to the lower limit of the $(N-1)^{th}$ one of the first voltage sub-ranges (i.e., $VA_{N-1}$); for the $n^{th}$ one of the first DAC portions ($11_n$), the magnitude of the respective one of the first bulk voltages is equal to the upper limit of the corresponding one of the first voltage sub-ranges (i.e., $VA_{n+1}$), and the respective one of the first logic low levels is equal to the lower limit of the $(n-1)^{th}$ one of the first voltage sub-ranges (i.e., $VA_{n-1}$), where 2≤n≤N-1; and for the first one of the first DAC portions ($11_1$), the magnitude of the respective one of the first bulk voltages is equal to the upper limit of the corresponding one of the first voltage sub-ranges (i.e., $VA_2$), and the respective one of the first logic low levels is equal to the lower limit of the $M^{th}$ one of the second voltage sub-ranges ($VB_M$).

The first selector 21 includes a plurality of pMOSFETs (not shown) and a plurality of N-type metal oxide semiconductor field effect transistors (nMOSFETs) (not shown), each of which has a bulk terminal and a gate terminal. As shown in Table 1 below, for the first selector 21, the bulk terminals of the pMOSFETs are for receiving a bulk voltage with a magnitude that is greater than or equal to a maximum of the magnitudes of the first input voltages, and that is smaller than or equal to an upper limit of the first voltage range (i.e., $VA_{N+1}$); the bulk terminals of the nMOSFETs are for receiving a bulk voltage with a magnitude that is greater than or equal to a lower limit of the first voltage range (i.e., $VA_1$), and that is smaller than or equal to a minimum of the magnitudes of the first input voltages; and the gate terminal of each of the pMOSFETs and the nMOSFETs is for receiving a gate signal with a voltage magnitude that switches between the upper and lower limits of the first voltage range (i.e., $VA_{N+1}$ and $VA_1$).

TABLE 1

| element | corresponding first voltage sub-range | voltage requirement |
|---|---|---|
| first DAC portion ($11_N$) | $VA_N - VA_{N+1}$ | maximum of magnitude(s) of received first input voltage(s) ≤ magnitude of respective first bulk voltage ≤ $VA_{N+1}$ (e.g., = maximum of magnitude(s) of received first input voltage(s)) respective first logic high level = $VA_{N+1}$ respective first logic low level < $VA_N$ (e.g., = $VA_{N-1}$) |
| first DAC portion ($11_{N-1}$) | $VA_{N-1} - VA_N$ | maximum of magnitude(s) of received first input voltage(s) ≤ magnitude of respective first bulk voltage ≤ $VA_N$ (e.g., = $VA_N$) respective first logic high level = $VA_N$ respective first logic low level < $VA_{N-1}$ (e.g., = $VA_{N-2}$) |
| . | . | . |
| . | . | . |
| . | . | . |
| first DAC portion ($11_2$) | $VA_2 - VA_3$ | maximum of magnitude(s) of received first input voltage (s) ≤ magnitude of respective first bulk voltage ≤ $VA_3$ (e.g., = $VA_3$) respective first logic high level = $VA_3$ respective first logic low level < $VA_2$ (e.g., = $VA_1$) |
| first DAC portion ($11_1$) | $VA_1 - VA_2$ | maximum of magnitude(s) of received first input voltage (s) ≤ magnitude of respective first bulk voltage ≤ $VA_2$ (e.g., = $VA_2$) respective first logic high level = $VA_2$ respective first logic low level < $VA_1$ (e.g., = $VB_M$) |

TABLE 1-continued

| element | corresponding first voltage sub-range | voltage requirement |
|---|---|---|
| first selector 12 | | maximum of magnitudes of first input voltages ≤ magnitude of bulk voltage of pMOSFETs ≤ $VA_{N+1}$ $VA_1$ ≤ magnitude of bulk voltage of nMOSFETs ≤ minimum of magnitudes of first input voltages voltage magnitude of gate signal of each MOSFET switches between $VA_{N+1}$ and $VA_1$ |

In this embodiment, each of the second DAC portions ($21_1$-$21_M$) includes a plurality of nMOSFETs (not shown), each of which has a bulk terminal and a gate terminal. The bulk terminals of the nMOSFETs of each of the second DAC portions ($21_1$-$21_M$) are for receiving a respective one of a plurality of second bulk voltages with different magnitudes. The gate terminal of each of the nMOSFETs of the second DAC portions ($21_1$-$21_N$) is for receiving a gate signal. Voltage magnitudes of the gate signals received by each of the second DAC portions ($21_1$-$21_M$) switch between a respective one of a plurality of different second logic high levels and a respective one of a plurality of different second logic low levels.

In particular, as shown in Table 2 below, for an $m^{th}$ one of the second DAC portions ($21_m$), the magnitude of the respective one of the second bulk voltages is greater than or equal to a lower limit of the corresponding one of the second voltage sub-ranges (i.e., $VB_m$), and is smaller than or equal to a minimum of magnitude(s) of the at least one second input voltage received by the second DAC portion ($21_m$); the respective one of the second logic high levels is greater than an upper limit of the corresponding one of the second voltage sub-ranges (i.e., $VB_{m+1}$); and the respective one of the second logic low levels is equal to the lower limit of the corresponding one of the second voltage sub-ranges (i.e., $VB_m$), where $1 \leq m \leq M$. In an example, for the $M^{th}$ one of the second DAC portions ($21_M$), the magnitude of the respective one of the second bulk voltages is equal to the lower limit of the corresponding one of the second voltage sub-ranges (i.e., $VB_M$), and the respective one of the second logic high levels is equal to the upper limit of the first one of the first voltage sub-ranges (i.e., $VA_2$); for the $m^{th}$ one of the second DAC portions ($21_m$), the magnitude of the respective one of the second bulk voltages is equal to the lower limit of the corresponding one of the second voltage sub-ranges (i.e., $VB_m$), and the respective one of the second logic high levels is equal to the upper limit of the $(m+1)^{th}$ one of the second voltage sub-ranges (i.e., $VB_{m+2}$), where $2 \leq m \leq M-1$; and for the first one of the second DAC portions ($21_1$), the magnitude of the respective one of the second bulk voltages is equal to the minimum of the magnitude(s) of the at least one second input voltage received by the second DAC portion ($21_1$), and the respective one of the second logic high levels is equal to the upper limit of the second one of the second voltage sub-ranges (i.e., $VB_3$).

The second selector 22 includes a plurality of pMOSFETs (not shown) and a plurality of nMOSFETs (not shown), each of which has a bulk terminal and a gate terminal. As shown in Table 2 below, for the second selector 22, the bulk terminals of the pMOSFETs are for receiving a bulk voltage with a magnitude that is greater than or equal to a maximum of the magnitudes of the second input voltages, and that is smaller than or equal to an upper limit of the second voltage range (i.e., $VB_{M+1}$); the bulk terminals of the nMOSFETs are for receiving a bulk voltage with a magnitude that is greater than or equal to a lower limit of the second voltage range (i.e., $VB_1$), and that is smaller than or equal to a minimum of the magnitudes of the second input voltages; and the gate terminal of each of the pMOSFETs and the nMOSFETs is for receiving a gate signal with a voltage magnitude that switches between the upper and lower limits of the second voltage range (i.e., $VB_{M+1}$ and $VB_1$).

TABLE 2

| element | corresponding second voltage sub-range | voltage requirement |
| --- | --- | --- |
| second DAC portion ($21_M$) | $VB_M$ – $VB_{M+1}$ | $VB_M$ ≤ magnitude of respective second bulk voltage ≤ minimum of magnitude(s) of received second input voltage(s) (e.g., = $VB_M$) respective second logic high level > $VB_{M+1}$ (e.g., = $VA_2$) respective second logic low level = $VB_M$ |
| second DAC portion ($21_{M-1}$) | $VB_{M-1}$ – $VB_M$ | $VB_{M-1}$ ≤ magnitude of respective second bulk voltage ≤ minimum of magnitude(s) of received second input voltage(s) (e.g., = $VB_{M-1}$) respective second logic high level > $VB_M$ (e.g., = $VB_{M+1}$) respective second logic low level = $VB_{M-1}$ |
| . | . | . |
| . | . | . |
| . | . | . |
| second DAC portion ($21_2$) | $VB_2$ – $VB_3$ | $VB_2$ ≤ magnitude of respective second bulk voltage ≤ minimum of magnitude(s) of received second input voltage(s) (e.g., = $VB_2$) respective second logic high level > $VB_3$ (e.g., = $VB_4$) respective second logic low level = $VB_2$ |
| second DAC portion ($21_1$) | $VB_1$ – $VB_2$ | $VB_1$ ≤ magnitude of respective second bulk voltage ≤ minimum of magnitude(s) of received second input voltage(s) (e.g., = minimum of magnitude(s) of received second input voltage(s)) respective second logic high level > $VB_2$ (e.g., = $VB_3$) respective second logic low level = $VB_1$ |

TABLE 2-continued

| element | corresponding second voltage sub-range | voltage requirement |
| --- | --- | --- |
| second selector 22 | | maximum of magnitudes of second input voltages ≤ magnitude of bulk voltage of pMOSFETs ≤ $VB_{M+1}$ $VB_1$ ≤ magnitude of bulk voltage of nMOSFETs ≤ minimum of magnitudes of second input voltages voltage magnitude of gate signal of each MOSFET switches between $VB_{M+1}$ and $VB_1$ |

The level shifter 3 is coupled to the first and second DAC circuits 1, 2, is for receiving the digital input signal, and generates, based on the digital input signal, the gate signals for controlling operations of the pMOSFETs and the nMOSFETs of the first and second DAC circuits 1, 2 between conduction and non-conduction.

Figure 2:
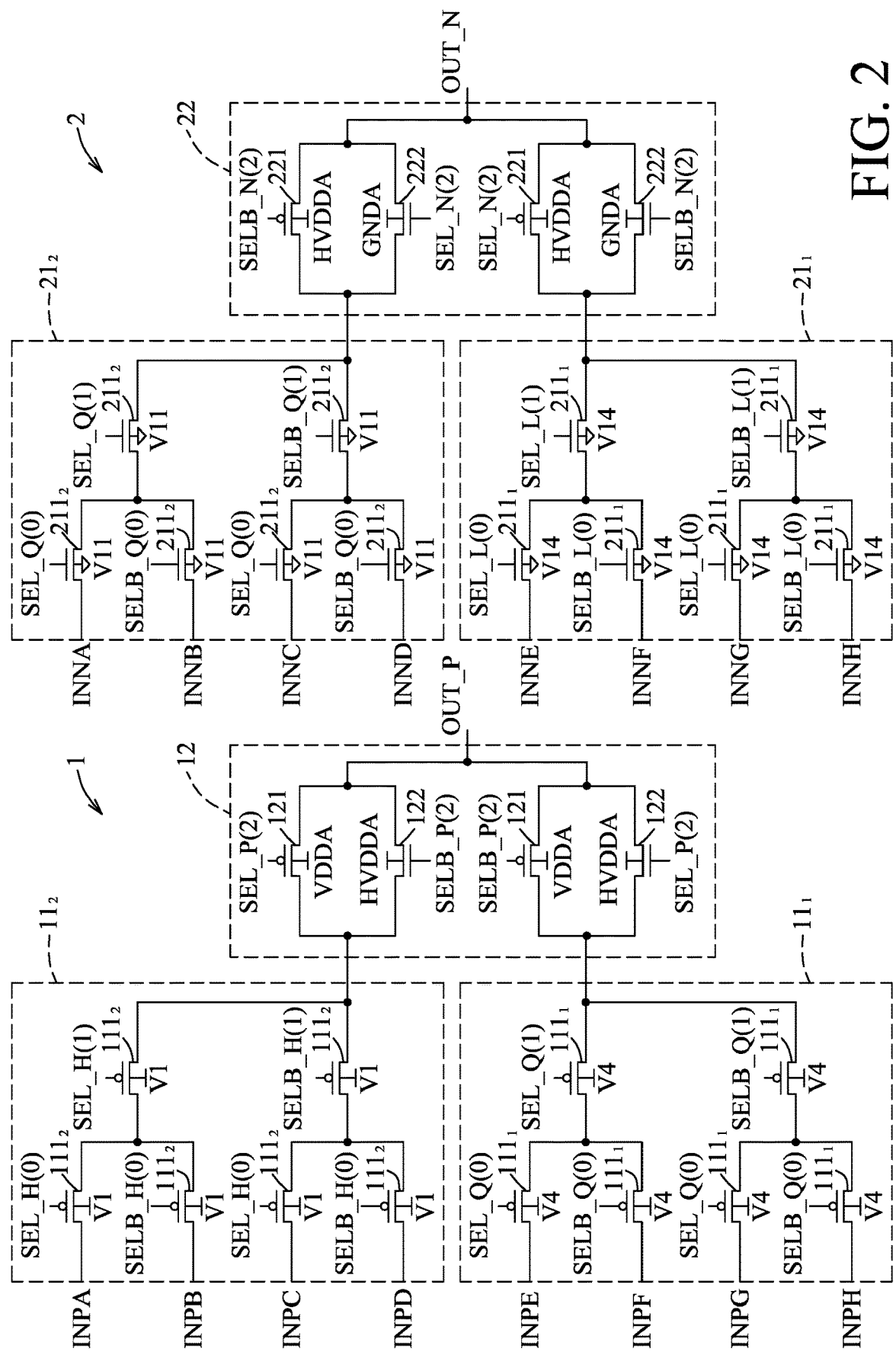
FIGS. 2 and 3 are circuit/block diagrams illustrating a first exemplary implementation of the first embodiment.
Figure 3:
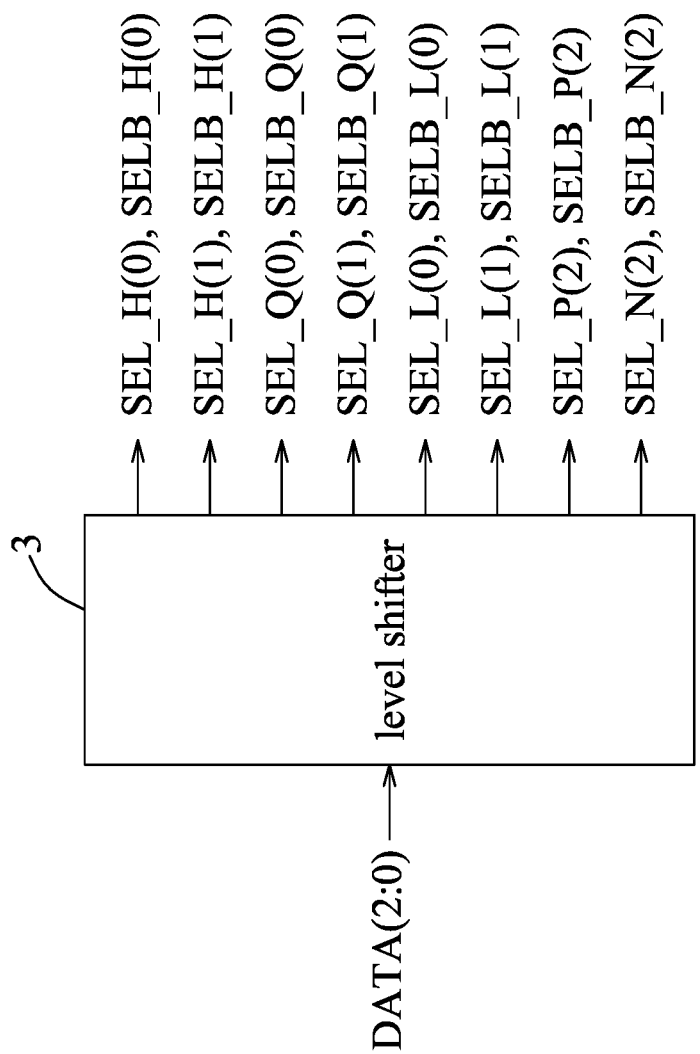
Figure 4:
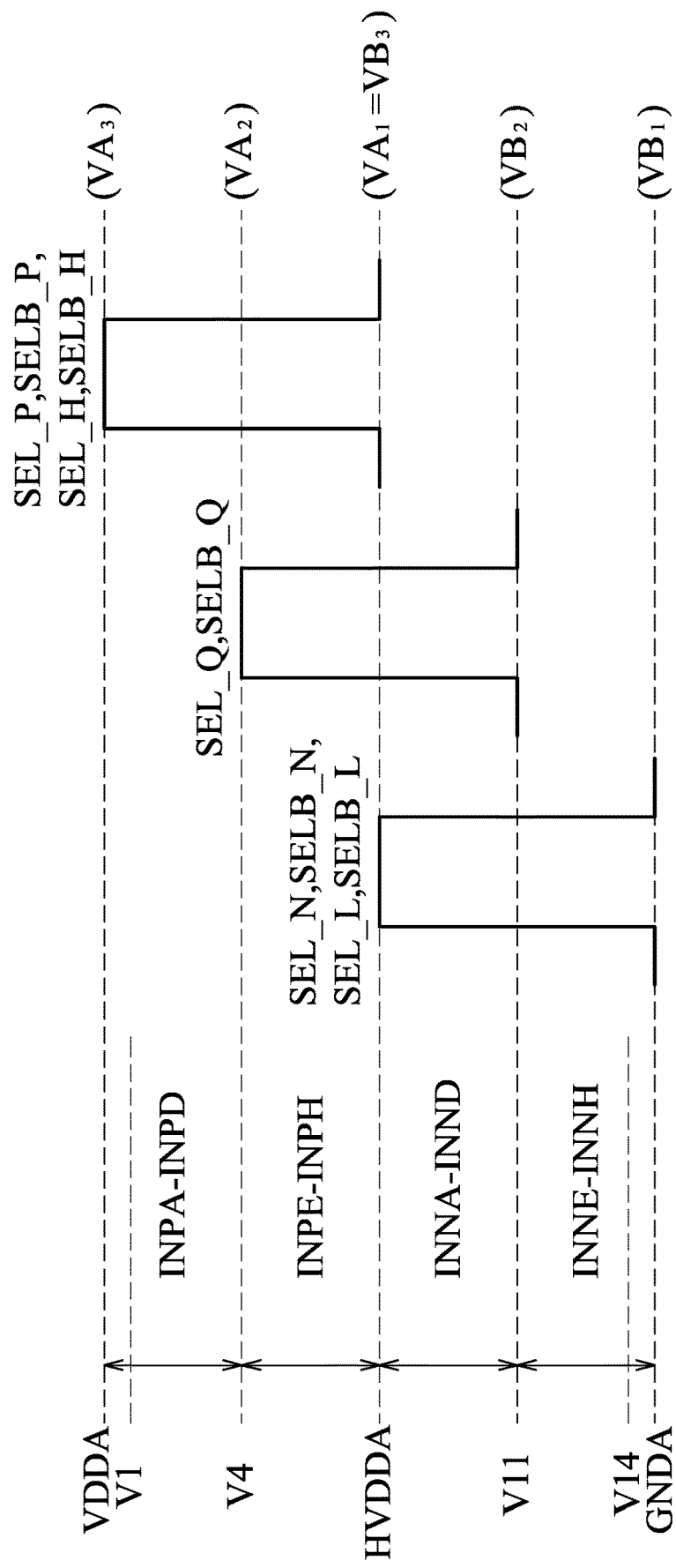
FIG. 4 is a plot illustrating relationships among first and second voltage sub-ranges, first and second input voltages and gate signals of the first exemplary implementation of the first embodiment.

FIGS. 2 to 4 and Table 3 below cooperatively illustrate a first exemplary implementation of the DAC device of this embodiment. In the first exemplary implementation, the digital input signal (DATA(2:0)) is three-bit wide, there are eight first input voltages (INPA-INPH) and eight second input voltages (INNA-INNH), and N=M=2. In addition, $VA_3$, $VA_2$ and $VA_1$ are respectively equal to vdda, 0.75×vdda and 0.5×vdda, and $VB_3$, $VB_2$ and $VB_1$ are respectively equal to 0.5×vdda, 0.25×vdda and 0, where vdda is a magnitude of a supply voltage (VDDA) for powering the DAC device.

The second one of the first DAC portions $11_2$ is for receiving the first input voltages (INPA-INPD) that are within the second one of the first voltage sub-ranges (i.e., within $VA_2$ to $VA_3$), and includes six pMOSFETs $111_2$. For the second one of the first DAC portions $11_2$, the first bulk voltage (V1) for biasing the bulk terminals of the pMOSFETs $111_2$ has the magnitude that is equal to the maximum of the magnitudes of the first input voltages (INPA-INPD); and the gate signals (SEL_H(0), SELB_H(0), SEL_H(1), SELB_H(1)) for controlling the operations of the pMOSFETs $111_2$ have the voltage magnitudes that switch between the upper limit of the second one of the first voltage sub-ranges (i.e., $VA_3$) and the lower limit of the first one of the first voltage sub-ranges (i.e., $VA_1$).

The first one of the first DAC portions $11_1$ is for receiving the first input voltages (INPE-INPH) that are within the first one of the first voltage sub-ranges (i.e., within $VA_1$ to $VA_2$), and includes six pMOSFETs $111_1$. For the first one of the first DAC portions $11_1$, the first bulk voltage (V4) for biasing the bulk terminals of the pMOSFETs $111_1$ has the magnitude that is equal to the upper limit of the first one of the first voltage sub-ranges (i.e., $VA_2$); and the gate signals (SEL_Q(0), SELB_Q(0), SEL_Q(1), SELB_Q(1)) for controlling the operations of the pMOSFETs $111_1$ have the voltage magnitudes that switch between the upper limit of the first one of the first voltage sub-ranges (i.e., $VA_2$) and the lower limit of the second one of the second voltage sub-ranges (i.e., $VB_2$).

The first selector 12 includes two pMOSFETs 121 and two nMOSFETs 122. For the first selector 12, the supply voltage (VDDA) with the magnitude that is equal to the upper limit of the first voltage range (i.e., $VA_3$) is taken as the bulk voltage for biasing the bulk terminals of the pMOSFETs 121; the bulk voltage (HVDDA) for biasing the bulk terminals of the nMOSFETs 122 has the magnitude that is equal to the lower limit of the first voltage range (i.e., $VA_1$); and the gate signals (SEL_P(2), SELB_P(2)) for controlling the operations of the pMOSFETs 121 and the nMOSFETs 122 have the voltage magnitudes that switch between the upper and lower limits of the first voltage range (i.e., $VA_3$ and $VA_1$).

The second one of the second DAC portions $21_2$ is for receiving the second input voltages (INNA-INND) that are within the second one of the second voltage sub-ranges (i.e., within $VB_2$ to $VB_3$), and includes six nMOSFETs $211_2$. For the second one of the second DAC portion $21_2$, the second bulk voltage (V11) for biasing the bulk terminals of the nMOSFETs $211_2$ has the magnitude that is equal to the lower limit of the second one of the second voltage sub-ranges (i.e., $VB_2$); and the gate signals (SEL_Q(0), SELB_Q(0), SEL_Q(1), SELB_Q(1)) with the voltage magnitudes that switch between the upper limit of the first one of the first voltage sub-ranges (i.e., $VA_2$) and the lower limit of the second one of the second voltage sub-ranges (i.e., $VB_2$) are also used to control the operations of the nMOSFETs $211_2$.

The first one of the second DAC portions $21_1$ is for receiving the second input voltages (INNE-INNH) that are within the first one of the second voltage sub-ranges (i.e., within $VB_1$ to $VB_2$), and includes six nMOSFETs $211_1$. For the first one of the second DAC portions $21_1$, the second bulk voltage (V14) for biasing the bulk terminals of the nMOSFETs $211_1$ has the magnitude that is equal to the minimum of the magnitudes of the second input voltages (INNE-INNH); and the gate signals (SEL_L(0), SELB_L(0), SEL_L(1), SELB_L(1)) for controlling the operations of the nMOSFETs $211_1$ have the voltage magnitudes that switch between the upper limit of the second one of the second voltage sub-ranges (i.e., $VB_3$) and the lower limit of the first one of the second voltage sub-ranges (i.e., $VB_1$).

The second selector 22 includes two pMOSFETs 221 and two nMOSFETs 222. For the second selector 22, the bulk voltage (HVDDA) with the magnitude that is equal to the upper limit of the second voltage range (i.e., $VB_3$) is also used to bias the bulk terminals of the pMOSFETs 221; a ground voltage (GNDA) with a magnitude that is equal to the lower limit of the second voltage range (i.e., $VB_1$) is taken as the bulk voltage for biasing the bulk terminals of the nMOSFETs 222; and the gate signals (SEL_N(2), SELB_N(2)) for controlling the operations of the pMOSFETs 221 and the nMOSFETs 222 have the voltage magnitudes that switch between the upper and lower limits of the second voltage range (i.e., $VB_3$ and $VB_1$).

The level shifter 3 generates the gate signals (SEL_H(0), SELB_H(0), SEL_Q(0), SELB_Q(0), SEL_L(0), SELB_L(0)) based on the first bit of the digital input signal (DATA(0)), generates the gate signals (SEL_H(1), SELB_H(1), SEL_Q(1), SELB_Q(1), SEL_L(1), SELB_L(1)) based on the second bit of the digital input signal (DATA(1)), and generates the gate signals (SEL_P(2), SELB_P(2), SEL_N(2), SELB_N(2)) based on the third bit of the digital input signal (DATA(2)). The gate signals (SEL_*(r), SELB_*(r)) are complementary to each other, where "*" denotes any one of "H", "Q" and "L", and "r" denotes any one of "1" and "2". The gate signals (SEL_# (2), SELB_# (2)) are complementary to each other, where "#" denotes any one of "P" and "N".

TABLE 3

| element | corresponding voltage sub-range | voltage requirement |
| --- | --- | --- |
| first DAC portion ($11_2$) | $VA_2 - VA_3$ | magnitude of V1 = maximum of magnitudes of INPA-INPD voltage magnitudes of SEL_H and SELB_H switch between $VA_3$ and $VA_1$ |
| first DAC portion ($11_1$) | $VA_2 - VA_3$ | magnitude of V4 = $VA_2$ voltage magnitudes of SEL_Q and SELB_Q switch between $VA_2$ and $VB_2$ |
| first selector 12 | | magnitude of VDDA = $VA_3$ magnitude of HVDDA = $VA_1$ voltage magnitudes of SEL_P and SELB_P switch between $VA_3$ and $VA_1$ |
| second DAC portion ($21_2$) | $VB_2 - VB_3$ | magnitude of V11 = $VB_2$ voltage magnitudes of SEL_Q and SELB_Q switch between $VA_2$ and $VB_2$ |
| second DAC portion ($21_1$) | $VB_2 - VB_3$ | magnitude of V14 = minimum of magnitudes of INNE-INNH voltage magnitudes of SEL_L and SELB_L switch between $VB_3$ and $VB_1$ |
| second selector 22 | | magnitude of HVDDA = $VB_3$ magnitude of GNDA = $VB_1$ voltage magnitudes of SEL_N and SELB_N switch between $VB_3$ and $VB_1$ |

Figure 5:
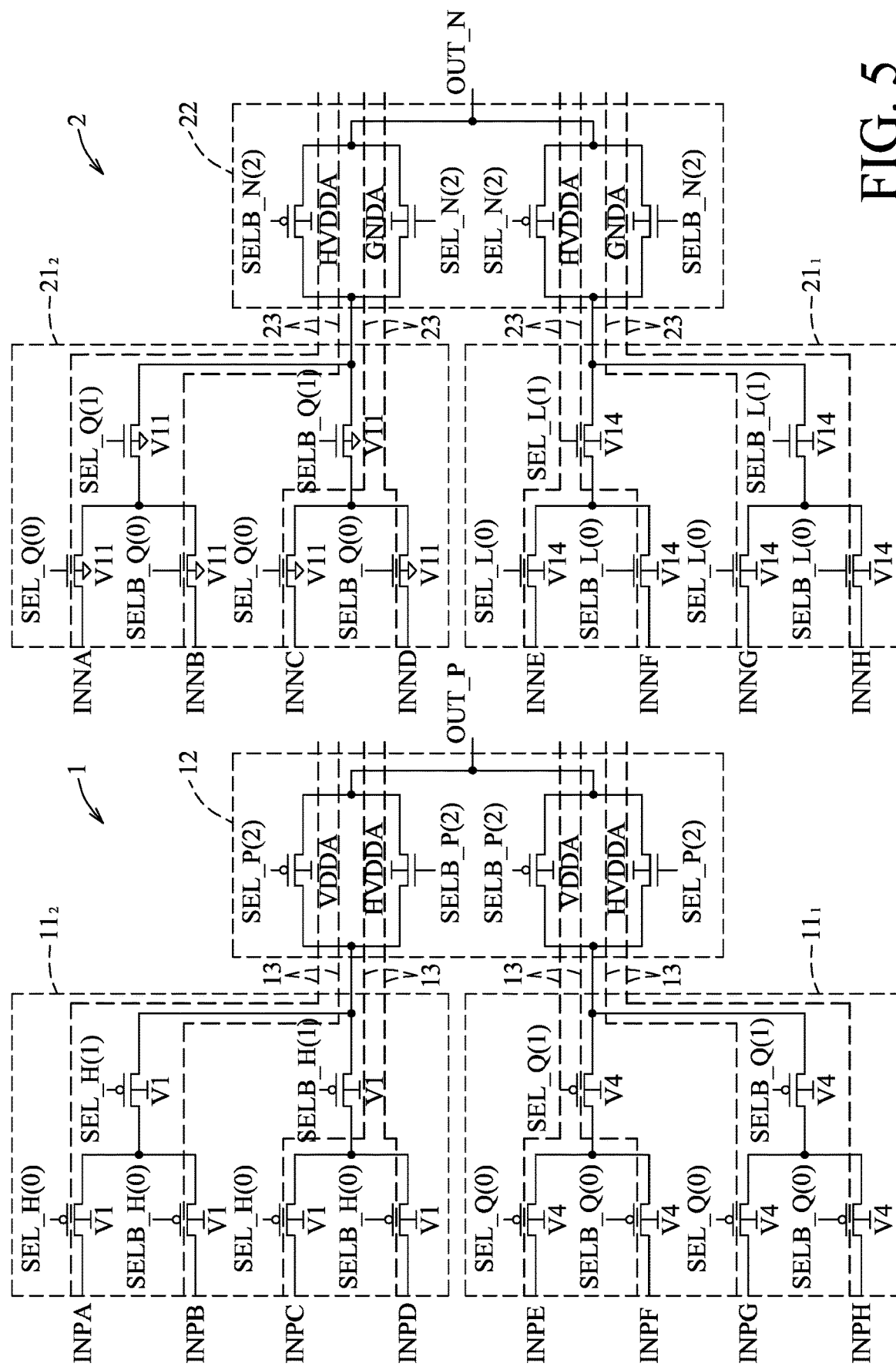
FIG. 5 is a circuit diagram illustrating first and second transmission paths of the first exemplary implementation of the first embodiment.

Referring back to FIG. 1, in this embodiment, each of the first DAC portions ($11_1$-$11_N$) cooperates with the first selector 12 to define at least one first transmission path (not shown) therebetween, each of which, when active (i.e., the MOSFETs in the transmission path all conduct), allows a respective one of the at least one first input voltage received by the first DAC portion to transmit therethrough and to serve as the first output voltage. The first DAC portions ($11_1$-$11_N$) and the first selector 12 are cooperatively operable to activate only one of the first transmission paths. The pMOSFETs of the first DAC portions ($11_1$-$11_N$) are respectively designed with width to length ratios in such a way that resistances respectively provided by the first transmission paths when active are substantially the same. As shown in FIG. 5, in the first exemplary implementation, eight first transmission paths 13 are defined, and one of them is active at a time.

Similarly, in this embodiment, each of the second DAC portions ($21_1$-$21_M$) cooperates with the second selector 22 to define at least one second transmission path (not shown) therebetween, each of which, when active (i.e., the MOSFETs in the transmission path all conduct), allows a respective one of the at least one second input voltage received by the second DAC portion to transmit therethrough and to serve as the second output voltage. The second DAC portions ($21_1$-$21_M$) and the second selector 22 are cooperatively operable to activate only one of the second transmission paths. The nMOSFETs of the second DAC portions ($21_1$-$21_N$) are respectively designed with width to length ratios in such a way that resistances respectively provided by the second transmission paths when active are substantially the same. As shown in FIG. 5, in the first exemplary implementation, eight second transmission paths 23 are defined, and one of them is active at a time.

Figure 6:
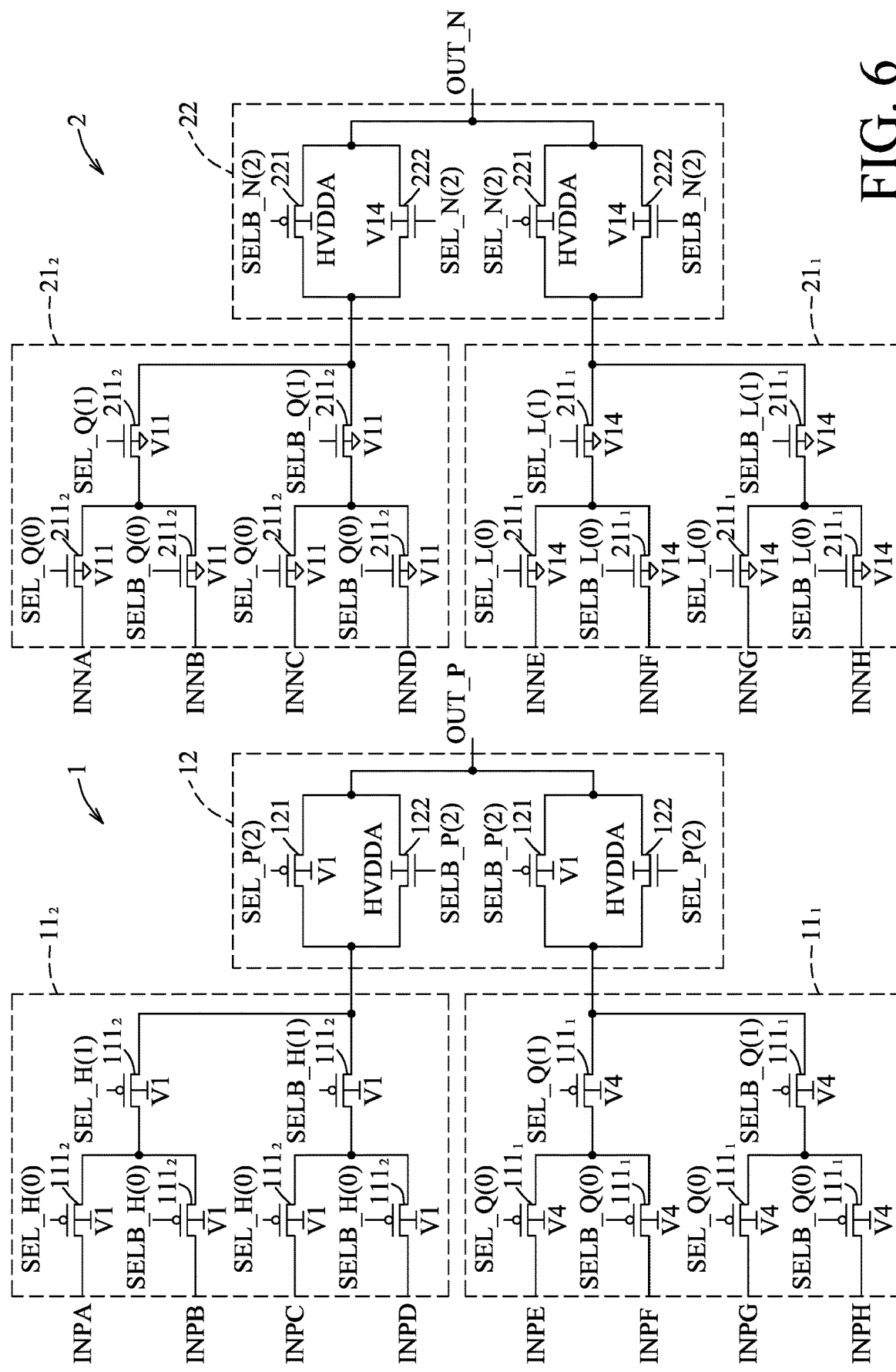
FIG. 6 is a circuit diagram illustrating a second exemplary implementation of the first embodiment.

FIG. 6 illustrates a second exemplary implementation of the DAC device of this embodiment. The second exemplary implementation is similar to the first exemplary implementation, and differs from the first exemplary implementation in that: (a) the bulk terminals of the pMOSFETs 121 of the first selector 12 are biased by the first bulk voltage (V1) with the magnitude that is equal to the maximum of the magnitudes of the first input voltage (INPA-INPH), instead of by the supply voltage (VDDA); and (b) the bulk terminals of the nMOSFETs 222 of the second selector 22 are biased by the second bulk voltage (V14) with the magnitude that is equal to the minimum of the magnitudes of the second input voltage (INNA-INNH), instead of by the ground voltage (GNDA).

Figure 7:
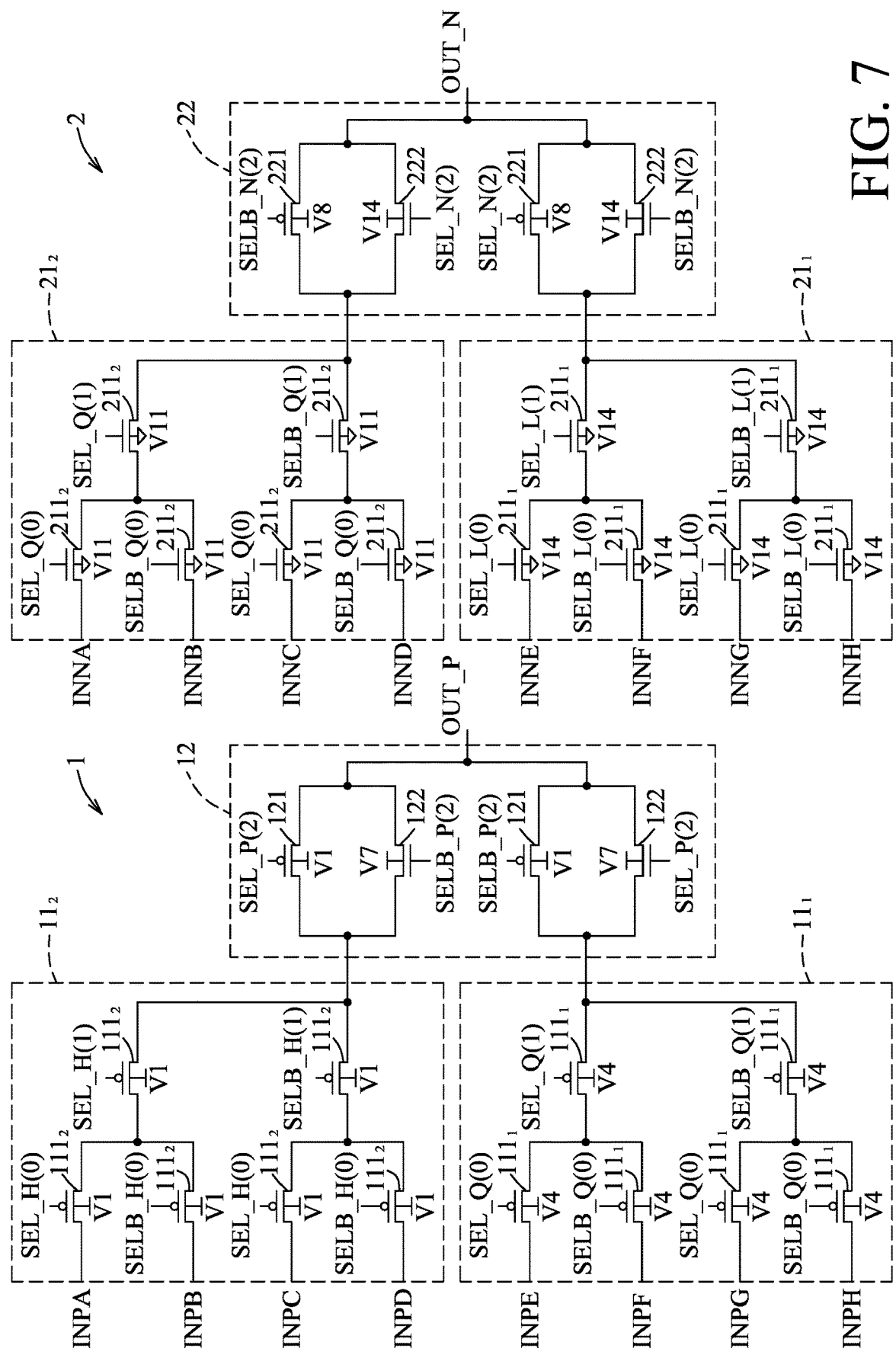
FIG. 7 is a circuit diagram illustrating a third exemplary implementation of the first embodiment.

FIG. 7 illustrates a third exemplary implementation of the DAC device of this embodiment. The third exemplary implementation is similar to the second exemplary implementation, and differs from the second exemplary implementation in that: (a) the bulk terminals of the nMOSFETs 122 of the first selector 12 are biased by a bulk voltage (V7) with a magnitude that is equal to the minimum of the magnitudes of the first input voltage (INPA-INPH), instead of by the bulk voltage (HVDDA); and (b) the bulk terminals of the pMOSFETs 221 of the second selector 22 are biased by a bulk voltage (V8) with a magnitude that is equal to the maximum of the magnitudes of the second input voltage (INNA-INNH), instead of by the bulk voltage (HVDDA).

Referring back to FIG. 1, in view of the above, as compared to the conventional DAC circuit, the first DAC circuit 1 of this embodiment has the following advantages.

1. Since the first DAC portions ($11_1$-$11_N$) do not includes nMOSFETs, the total number of the nMOSFETs of the first DAC circuit 1 can be reduced to be smaller than the total number of the pMOSFETs of the first DAC circuit 1, resulting in that the first DAC circuit 1 uses less MOSFETs and occupies less area.

2. The bulk terminals of the pMOSFETs of each of the first DAC portions ($11_1$-$11_N$) can be biased at a bulk voltage with a magnitude smaller than the most positive voltage level (i.e., $VA_{N+1}$), resulting in that few of the pMOSFETs of the first DAC circuit 1 have significant body effects and large ON resistances.

3. For each of the first DAC portions ($11_1$-$11_N$), since the respective one of the first logic low levels is smaller than the lower limit of the corresponding one of the first voltage sub-ranges, the respective one of the first logic low levels can be sufficiently below the at least one first input voltage to be transmitted by the first DAC portion, such that it is easy for each of the pMOSFETs of the first DAC portion to conduct.

Similarly, as compared to the conventional DAC circuit, the second DAC circuit 2 of this embodiment has the following advantages.

1. Since the second DAC portions ($21_1$-$21_M$) do not includes pMOSFETs, the total number of the pMOSFETs of the second DAC circuit 2 can be reduced to be smaller than the total number of the nMOSFETs of the second DAC circuit 2, resulting in that the second DAC circuit 2 uses less MOSFETs and occupies less area.

2. The bulk terminals of the nMOSFETs of each of the second DAC portions ($21_1$-$21_M$) can be biased at a bulk voltage with a magnitude greater than the most negative voltage level (i.e., $VB_1$), resulting in that few of the nMOSFETs of the second DAC circuit 2 have significant body effects and large ON resistances.

3. For each of the second DAC portions ($21_1$-$21_M$), since the respective one of the second logic high levels is greater than the upper limit of the corresponding one of the second voltage sub-ranges, the respective one of the second logic high levels can be sufficiently above the at least one second input voltage to be transmitted by the second DAC portion, such that it is easy for each of the nMOSFETs of the second DAC portion to conduct.

Figure 8:
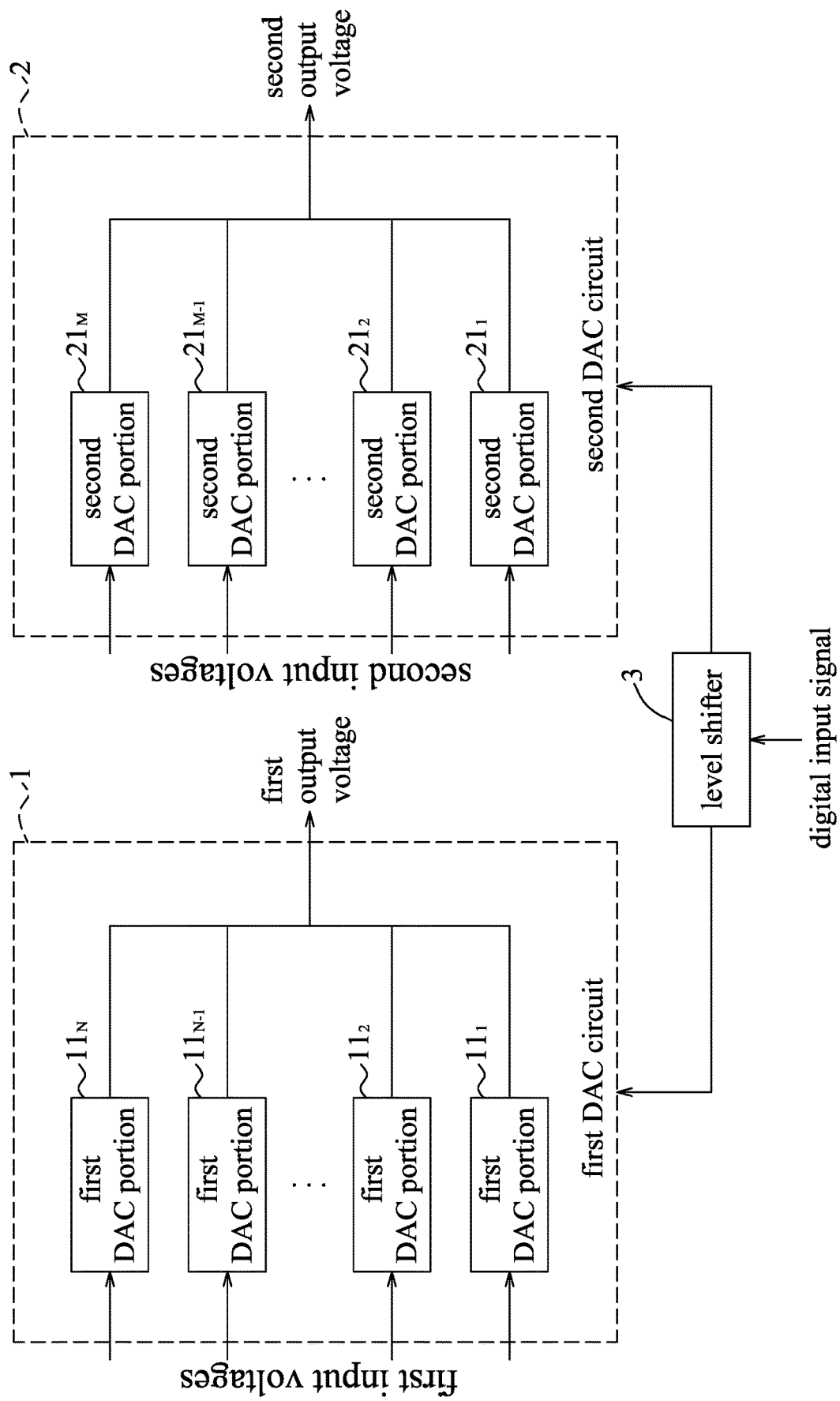
FIG. 8 is a block diagram illustrating a second embodiment of the DAC device according to the disclosure.
Figure 9:
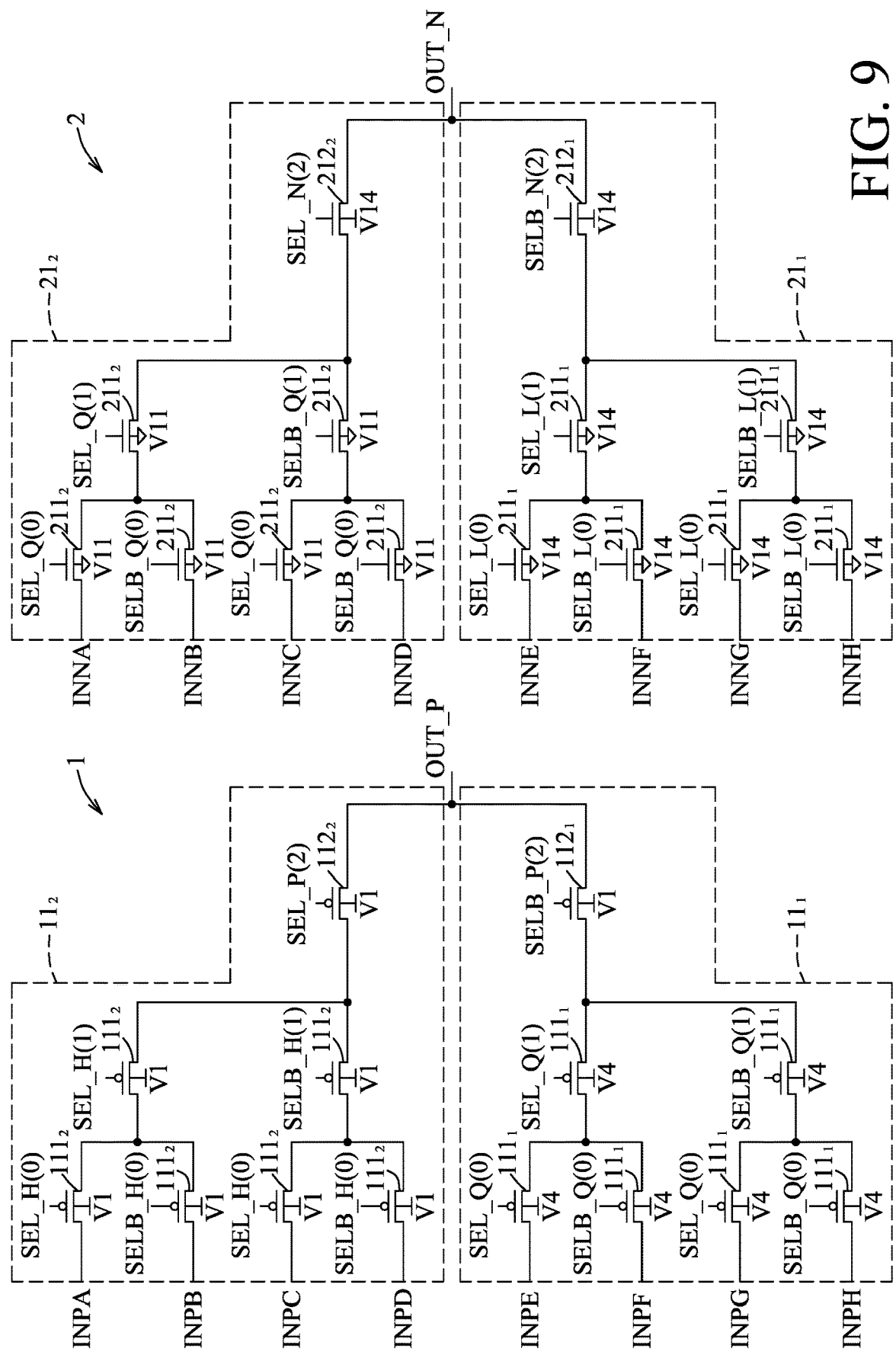
FIG. 9 is a circuit diagram illustrating an exemplary implementation of the second embodiment.
Figure 10:
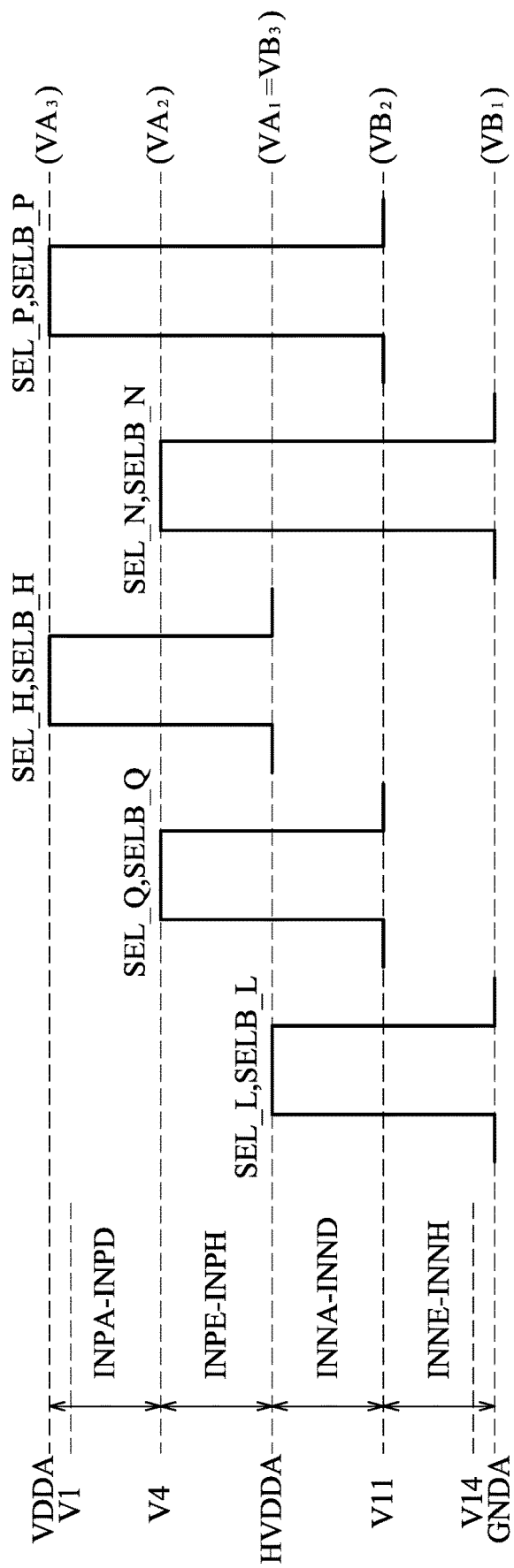
FIG. 10 is a plot illustrating relationships among first and second voltage sub-ranges, first and second input voltages and gate signals of the exemplary implementation of the second embodiment.
Figure 11:
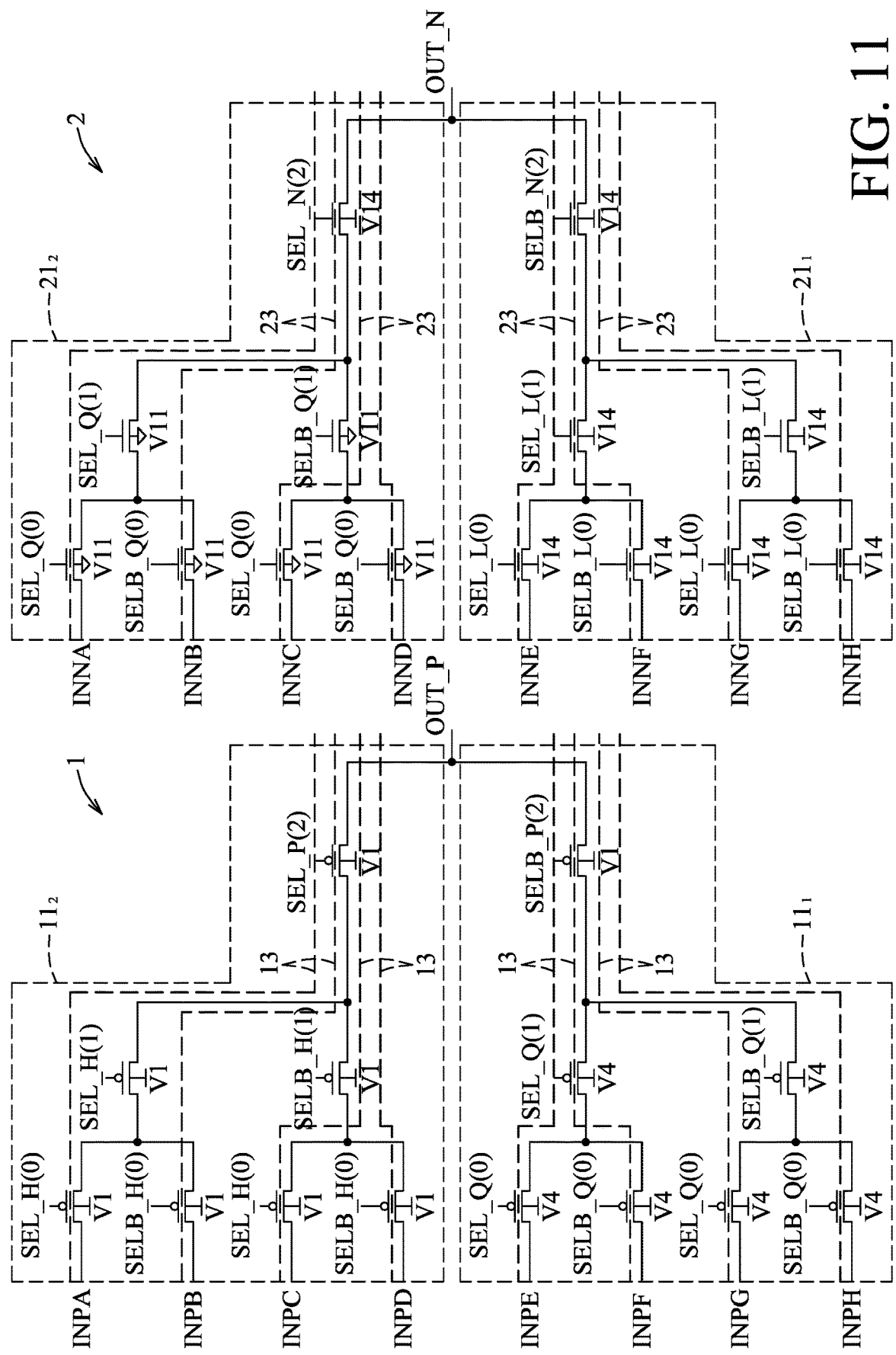
FIG. 11 is a circuit diagram illustrating first and second transmission paths of the exemplary implementation of the second embodiment.

Referring to FIG. 8, a second embodiment of the DAC device according to the disclosure is similar to the first embodiment, and differs from the first embodiment in what are described below.

In the second embodiment, the first and second selectors 12, 22 (see FIG. 1) are omitted. The first DAC portions ($11_1$-$11_N$) are coupled to one another, and cooperatively output one of the first input voltages to serve as the first output voltage. The second DAC portions ($21_1$-$21_M$) are coupled to one another, and cooperatively output one of the second input voltages to serve as the second output voltage.

Each of the first DAC portions ($11_1$-$11_N$) further includes at least one additional pMOSFET. The bulk terminals of the additional pMOSFETs of the first DAC portions ($11_1$-$11_N$) are for receiving one of the first bulk voltages that is received by the other pMOSFETs of the $N^{th}$ one of the first DAC portions ($11_N$). The gate terminal of each of the additional pMOSFETs of the first DAC portions ($11_1$-$11_N$) is for receiving a gate signal with a voltage magnitude that switches between the upper limit of the first voltage range (i.e., $VA_{N+1}$) and a voltage value smaller than the lower limit of the first voltage range (i.e., $VA_1$).

Each of the first DAC portions ($11_1$-$11_N$) defines at least one first transmission path (not shown), each of which, when active, allows a respective one of the at least one first input voltage received by the first DAC portion to transmit therethrough and to serve as the first output voltage. The first DAC portions ($11_1$-$11_N$) are cooperatively operable to activate only one of the first transmission paths. The pMOSFETs of the first DAC portions ($11_1$-$11_N$) are respectively designed with width to length ratios in such a way that resistances respectively provided by the first transmission paths when active are substantially the same.

Similarly, each of the second DAC portions ($21_1$-$21_M$) further includes at least one additional nMOSFET. The bulk terminals of the additional nMOSFETs of the second DAC portions ($21_1$-$21_M$) are for receiving one of the second bulk voltages that is received by the other nMOSFETs of the first one of the second DAC portions ($21_1$). The gate terminal of each of the additional nMOSFETs of the second DAC portions ($21_1$-$21_M$) is for receiving a gate signal with a voltage magnitude that switches between the lower limit of the second voltage range (i.e., $VB_1$) and a voltage value greater than the upper limit of the second voltage range (i.e., $VB_{M+1}$).

Each of the second DAC portions ($21_1$-$21_M$) defines at least one second transmission path (not shown), each of which, when active, allows a respective one of the at least one second input voltage received by the second DAC portion to transmit therethrough and to serve as the second output voltage. The second DAC portions ($21_1$-$21_M$) are cooperatively operable to activate only one of the second transmission paths. The nMOSFETs of the second DAC portions ($21_1$-$21_N$) are respectively designed with width to length ratios in such a way that resistances respectively provided by the second transmission paths when active are substantially the same.

FIGS. 3 and 9 to 11 cooperatively illustrate an exemplary implementation of the DAC device of the second embodiment, which is similar to the first exemplary implementation of the DAC device of the first embodiment.

In the exemplary implementation of the DAC device of the second embodiment, each of the first DAC portions $11_1$, $11_2$ includes an additional pMOSFETs $112_1$, $112_2$. The first bulk voltage (V1) for biasing the pMOSFETs $111_2$ of the second one of the first DAC portions ($11_2$) is also used to bias the bulk terminals of the additional pMOSFETs $112_1$, $112_2$ of the first DAC portions $11_1$, $11_2$. The gate signals (SEL_P(2), SELB_P(2)) for controlling operations of the additional pMOSFETs $112_1$, $112_2$ of the first DAC portions $11_1$, $11_2$ have voltage magnitudes that switch between the upper limit of the first voltage range (i.e., $VA_3$) and the lower limit of the second one of the second voltage sub-ranges (i.e., $VB_2$). Eight first transmission paths 13 are defined, and one of them is active at a time.

In addition, each of the second DAC portions $21_1$, $21_2$ includes an additional nMOSFETs $212_1$, $212_2$. The second bulk voltage (V14) for biasing the nMOSFETs $211_1$ of the first one of the second DAC portions ($21_1$) is also used to bias the bulk terminals of the additional nMOSFETs $212_1$, $212_2$ of the second DAC portions $21_1$, $21_2$.

The gate signals (SEL_N(2), SELB_N(2)) for controlling operations of the additional nMOSFETs $212_1$, $212_2$ of the second DAC portions $21_1$, $21_2$ have voltage magnitudes that switch between the upper limit of the first one of the first voltage sub-ranges (i.e., $VA_2$) and the lower limit of the second voltage range (i.e., $VB_1$).

Eight second transmission paths 23 are defined, and one of them is active at a time.

Referring back to FIG. 8, in view of the above, as compared to the conventional DAC circuit, the first DAC circuit 1 of this embodiment has the following advantages.

1. Since the first DAC circuit 1 do not includes nMOSFETs, it uses less MOSFETs and occupies less area.

2. The bulk terminal of each of the pMOSFETs of the first DAC circuit 1 can be biased at a voltage level smaller than the most positive voltage level (i.e., $VA_{N+1}$), resulting in that few of the pMOSFETs of the first DAC circuit 1 have significant body effects and large ON resistances.

3. For each of the first DAC portions ($11_1$-$11_N$), since each of the gate signals for controlling the operations of the pMOSFETs of the first DAC portion has a logic low level that is smaller than the lower limit of the corresponding one of the first voltage sub-ranges, the logic low levels of these gate signals can be sufficiently below the at least one first input voltage to be transmitted by the first DAC portion, such that it is easy for each of the pMOSFETs of the first DAC portion to conduct.

Similarly, as compared to the conventional DAC circuit, the second DAC circuit 2 of this embodiment has the following advantages.

1. Since the second DAC circuit 2 do not includes pMOSFETs, it uses less MOSFETs and occupies less area.

2. The bulk terminal of each of the nMOSFETs of the second DAC circuit 2 can be biased at a voltage level greater than the most negative voltage level (i.e., $VB_1$), resulting in that few of the nMOSFETs of the second DAC circuit 2 have significant body effects and large ON resistances.

3. For each of the second DAC portions ($21_1$-$21_M$), since each of the gate signals for controlling the operations of the nMOSFETs of the second DAC portion has a logic high level that is greater than the upper limit of the corresponding one of the second voltage sub-ranges, the logic high levels of these gate signals can be sufficiently above the at least one second input voltage to be transmitted by the second DAC portion, resulting in that it is easy for each of the nMOSFETs of the second DAC portion to conduct.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that the disclosure is not limited to the disclosed embodiments but is intended to cover various arrangements included within the spirit and scope of the broadest interpretation so as to encompass all such modifications and equivalent arrangements.

What is claimed is:

1. A digital to analog conversion (DAC) device adapted to receive a plurality of first input voltages that are within a first voltage range and a plurality of second input voltages that are within a second voltage range lower than the first voltage range, to output one of the first input voltages that corresponds to a value represented by a digital input signal to serve as a first output voltage, and to output one of the second input voltages that corresponds to the value represented by the digital input signal to serve as a second output voltage, said DAC device comprising:

a first DAC circuit including
a plurality of first DAC portions, each of which is for receiving at least one of the first input voltages, and which cooperatively output at least one of the first input voltages; and a second DAC circuit including
a plurality of second DAC portions, each of which is for receiving at least one of the second input voltages, and which cooperatively output at least one of the second input voltages;

wherein each of said first DAC portions includes a plurality of P-type metal oxide semiconductor field effect transistors (pMOSFETs), each of which has a bulk terminal and a gate terminal;

wherein said bulk terminals of at least some of said pMOSFETs of each of said first DAC portions are for receiving a respective one of a plurality of first bulk voltages with different magnitudes;

wherein said gate terminal of each of said pMOSFETs of said first DAC portions is for receiving a gate signal, and voltage magnitudes of at least some of the gate signals received by each of said first DAC portions switch between a respective one of a plurality of different first logic high levels and a respective one of a plurality of different first logic low levels;

wherein each of said second DAC portions includes a plurality of N-type metal oxide semiconductor field effect transistors (nMOSFETs), each of which has a bulk terminal and a gate terminal;

wherein said bulk terminals of at least some of said nMOSFETs of each of said second DAC portions are for receiving a respective one of a plurality of second bulk voltages with different magnitudes;

wherein said gate terminal of each of said nMOSFETs of said second DAC portions is for receiving a gate signal, and voltage magnitudes of at least some of the gate signals received by each of said second DAC portions switch between a respective one of a plurality of different second logic high levels and a respective one of a plurality of different second logic low levels.

2. The DAC device of claim 1, wherein:

each of said first DAC portions outputs one of the at least one first input voltage received thereby;

said first DAC circuit further includes a first selector that is coupled to said first DAC portions for receiving the first input voltages respectively outputted by said first DAC portions, and that outputs one of the first input voltages received thereby to serve as the first output voltage;

each of said second DAC portions outputs one of the at least one second input voltage received thereby; and second DAC circuit further includes a second selector that is coupled to said second DAC portions for receiving the second input voltages respectively outputted by said second DAC portions, and that outputs one of the second input voltages received thereby to serve as the second output voltage.

3. The DAC device of claim 2, wherein:

said first selector includes a plurality of pMOSFETs and a plurality of nMOSFETs, each of which has a bulk terminal and a gate terminal, where said bulk terminals of said pMOSFETs are for receiving a bulk voltage with a magnitude that is greater than or equal to a maximum of magnitudes of the first input voltages, and that is smaller than or equal to an upper limit of the first voltage range, where said bulk terminals of said nMOSFETs are for receiving a bulk voltage with a magnitude that is greater than or equal to a lower limit of the first voltage range, and that is smaller than or equal to a minimum of the magnitudes of the first input voltages, and where said gate terminal of each of said pMOSFETs and said nMOSFETs is for receiving a gate signal with a voltage magnitude that switches between the lower and upper limits of the first voltage range; and said second selector includes a plurality of pMOSFETs and a plurality of nMOSFETs, each of which has a bulk terminal and a gate terminal, where said bulk terminals of said pMOSFETs are for receiving a bulk voltage with a magnitude that is greater than or equal to a maximum of magnitudes of the second input voltages, and that is smaller than or equal to an upper limit of the second voltage range, where said bulk terminals of said nMOSFETs are for receiving a bulk voltage with a magnitude that is greater than or equal to a lower limit of the second voltage range, and that is smaller than or equal to a minimum of the magnitudes of the second input voltages, and said gate terminal of each of said pMOSFETs and said nMOSFETs is for receiving a gate signal with a voltage magnitude that switches between the lower and upper limits of the second voltage range.

4. The DAC device of claim 2, wherein:

each of said first DAC portions cooperates with said first selector to define at least one first transmission path therebetween, each of which, when active, allows a respective one of the at least one first input voltage received by said first DAC portion to transmit therethrough and to serve as the first output voltage;

said first DAC portions and said first selector are cooperatively operable to activate only one of the first transmission paths;

said pMOSFETs of said first DAC portions are respectively designed with width to length ratios in such a way that resistances respectively provided by the first transmission paths when active are substantially the same;

each of said second DAC portions cooperates with said second selector to define at least one second transmission path therebetween, each of which, when active, allows a respective one of the at least one second input voltage received by said second DAC portion to transmit therethrough and to serve as the second output voltage;

said second DAC portions and said second selector are cooperatively operable to activate only one of the second transmission paths; and said nMOSFETs of said second DAC portions are respectively designed with width to length ratios in such a way that resistances respectively provided by the second transmission paths when active are substantially the same.

5. The DAC device of claim 1, wherein:

said first DAC portions are coupled to one another, and cooperatively output one of the first input voltages to serve as the first output voltage; and said second DAC portions are coupled to one another, and cooperatively output one of the second input voltages to serve as the second output voltage.

6. The DAC device of claim 5, wherein:

each of said first DAC portions defines at least one first transmission path, each of which, when active, allows a respective one of the at least one first input voltage received by said first DAC portion to transmit therethrough and to serve as the first output voltage;

said first DAC portions are cooperatively operable to activate only one of the first transmission paths;

said pMOSFETs of said first DAC portions are respectively designed with width to length ratios in such a way that resistances respectively provided by the first transmission paths when active are substantially the same;

each of said second DAC portions defines at least one second transmission path, each of which, when active, allows a respective one of the at least one second input voltage received by said second DAC portion to transmit therethrough and to serve as the second output voltage;

said second DAC portions are cooperatively operable to activate only one of the second transmission paths; and said nMOSFETs of said second DAC portions are respectively designed with width to length ratios in such a way that resistances respectively provided by the second transmission paths when active are substantially the same.

7. The DAC device of claim 1, wherein:

said first DAC portions respectively correspond to a plurality of consecutive first voltage sub-ranges that cooperatively constitute the first voltage range;

the at least one first input voltage received by each of said first DAC portions is within a corresponding one of the first voltage sub-ranges;

for each of said first DAC portions, the magnitude of the respective one of the first bulk voltages is greater than or equal to a maximum of magnitude(s) of the at least one first input voltage received by said first DAC portion, and is smaller than or equal to an upper limit of the corresponding one of the first voltage sub-ranges;

said second DAC portions respectively corresponding to a plurality of consecutive second voltage sub-ranges that cooperatively constitute the second voltage range;

the at least one second input voltage received by each of said second DAC portions is within a corresponding one of the second voltage sub-ranges; and for each of said second DAC portions, the magnitude of the respective one of the second bulk voltages is greater than or equal to a lower limit of the corresponding one of the second voltage sub-ranges, and is smaller than or equal to a minimum of magnitude(s) of the at least one second input voltage received by said second DAC portion.

8. The DAC device of claim 7, wherein:

for said first DAC portion that corresponds to an $n^{th}$ one of the first voltage sub-ranges, the magnitude of the respective one of the first bulk voltages is equal to the upper limit of the corresponding one of the first voltage sub-ranges, where $1 \leq n \leq N-1$, where N is a total number of the first voltage sub-ranges, and where the $n^{th}$ one of the first voltage sub-ranges is lower than an $(n+1)^{th}$ one of the first voltage sub-ranges; and for said second DAC portion that corresponds to an $m^{th}$ one of the second voltage sub-ranges, the magnitude of the respective one of the second bulk voltages is equal to the lower limit of the corresponding one of the second voltage sub-ranges, where $2 \leq m \leq M$, where M is a total number of the second voltage sub-ranges, and where the $m^{th}$ one of the second voltage sub-ranges is higher than an $(m-1)^{th}$ one of the second voltage sub-ranges.

9. The DAC device of claim 1, wherein:

said first DAC portions respectively correspond to a plurality of consecutive first voltage sub-ranges that cooperatively constitute the first voltage range;

the at least one first input voltage received by each of said first DAC portions is within a corresponding one of the first voltage sub-ranges;

for each of said first DAC portions, the respective one of the first logic high levels is equal to an upper limit of the corresponding one of the first voltage sub-ranges, and the respective one of the first logic low levels is smaller than a lower limit of the corresponding one of the first voltage sub-ranges;

said second DAC portions respectively corresponding to a plurality of consecutive second voltage sub-ranges that cooperatively constitute the second voltage range;

the at least one second input voltage received by each of said second DAC portions is within a corresponding one of the second voltage sub-ranges; and for each of said second DAC portions, the respective one of the second logic low levels is equal to a lower limit of the corresponding one of the second voltage sub-ranges, and the respective one of the second logic high levels is greater than an upper limit of the corresponding one of the second voltage sub-ranges.

10. The DAC device of claim 9, wherein:

for said first DAC portion that corresponds to an $n^{th}$ one of the first voltage sub-ranges, the respective one of the first logic low levels is equal to the lower limit of an $(n-1)^{th}$ one of the first voltage sub-ranges, where $2 \leq n \leq N$, where N is a total number of the first voltage sub-ranges, and where the $n^{th}$ one of the first voltage sub-ranges is higher than the $(n-1)^{th}$ one of the first voltage sub-ranges;

for said second DAC portion that corresponds to an $m^{th}$ one of the second voltage sub-ranges, the respective one of the second logic high levels is equal to the upper limit of an $(m+1)^{th}$ one of the second voltage sub-ranges, where $1 \leq m \leq M-1$, where M is a total number of the second voltage sub-ranges, and where the $m^{th}$ one of the second voltage sub-ranges is lower than the $(m+1)^{th}$ one of the second voltage sub-ranges;

for said first DAC portion that corresponds to the first one of the first voltage sub-ranges, the respective one of the first logic low levels is equal to the lower limit of the $M^{th}$ one of the second voltage sub-ranges; and for said second DAC portion that corresponds to the $M^{th}$ one of the second voltage sub-ranges, the respective one of the second logic high levels is equal to the upper limit of the first one of the first voltage sub-ranges.

11. A digital to analog conversion (DAC) circuit adapted to receive a plurality of input voltages that are within a voltage range, and to output one of the input voltages that corresponds to a value represented by a digital input signal to serve as an output voltage, said DAC circuit comprising:

a plurality of DAC portions, each of which is for receiving at least one of the input voltages, and which cooperatively output at least one of the input voltages;

wherein each of said DAC portions includes a plurality of P-type metal oxide semiconductor field effect transistors (pMOSFETs), each of which has a bulk terminal and a gate terminal;

wherein said bulk terminals of at least some of said pMOSFETs of each of said DAC portions are for receiving a respective one of a plurality of bulk voltages with different magnitudes;

wherein said gate terminal of each of said pMOSFETs of said DAC portions is for receiving a gate signal, and voltage magnitudes of at least some of the gate signals received by each of said DAC portions switch between a respective one of a plurality of different logic high levels and a respective one of a plurality of different logic low levels.

12. The DAC circuit of claim 11, wherein:

said DAC portions respectively correspond to a plurality of consecutive voltage sub-ranges that cooperatively constitute the voltage range;

the at least one input voltage received by each of said DAC portions is within a corresponding one of the voltage sub-ranges;

for each of said DAC portions, the magnitude of the respective one of the bulk voltages is greater than or equal to a maximum of magnitude(s) of the at least one input voltage received by said DAC portion, and is smaller than or equal to an upper limit of the corresponding one of the voltage sub-ranges; and for each of said DAC portions, the respective one of the logic high levels is equal to the upper limit of the corresponding one of the voltage sub-ranges, and the respective one of the logic low levels is smaller than a lower limit of the corresponding one of the voltage sub-ranges.

13. The DAC circuit of claim 12, wherein:

for said DAC portion that corresponds to an $n^{th}$ one of the voltage sub-ranges, the magnitude of the respective one of the bulk voltages is equal to the upper limit of the corresponding one of the voltage sub-ranges, where $1 \leq n \leq N-1$, where N is a total number of the voltage sub-ranges, and where the $n^{th}$ one of the voltage sub-ranges is lower than an $(n+1)^{th}$ one of the voltage sub-ranges.

14. The DAC circuit of claim 12, wherein:
for said DAC portion that corresponds to an $n^{th}$ one of the voltage sub-ranges, the respective one of the logic low levels is equal to the lower limit of an $(n-1)^{th}$ one of the voltage sub-ranges, where $2 \leq n \leq N$, where N is a total number of the voltage sub-ranges, and where the $n^{th}$ one of the voltage sub-ranges is higher than the $(n-1)^{th}$ one of the voltage sub-ranges.

15. A digital to analog conversion (DAC) circuit adapted to receive a plurality of input voltages that are within a voltage range, and to output one of the input voltages that corresponds to a value represented by a digital input signal to serve as an output voltage, said DAC circuit comprising:
a plurality of DAC portions, each of which is for receiving at least one of the input voltages, and which cooperatively output at least one of the input voltages;
wherein each of said DAC portions includes a plurality of N-type metal oxide semiconductor field effect transistors (nMOSFETs), each of which has a bulk terminal and a gate terminal;
wherein said bulk terminals of at least some of said nMOSFETs of each of said DAC portions are for receiving a respective one of a plurality of bulk voltages with different magnitudes;
wherein said gate terminal of each of said nMOSFETs of said DAC portions is for receiving a gate signal, and voltage magnitudes of at least some of the gate signals received by each of said DAC portions switch between a respective one of a plurality of different logic high levels and a respective one of a plurality of different logic low levels.

16. The DAC circuit of claim 15, wherein:
said DAC portions respectively corresponding to a plurality of consecutive voltage sub-ranges that cooperatively constitute the voltage range;
the at least one input voltage received by each of said DAC portions is within a corresponding one of the voltage sub-ranges;
for each of said DAC portions, the magnitude of the respective one of the bulk voltages is greater than or equal to a lower limit of the corresponding one of the voltage sub-ranges, and is smaller than or equal to a minimum of magnitude(s) of the at least one input voltage received by said DAC portion; and
for each of said DAC portions, the respective one of the logic low levels is equal to the lower limit of the corresponding one of the voltage sub-ranges, and the respective one of the logic high levels is greater than an upper limit of the corresponding one of the voltage sub-ranges.

17. The DAC circuit of claim 16, wherein:
for said DAC portion that corresponds to an $m^{th}$ one of the voltage sub-ranges, the magnitude of the respective one of the bulk voltages is equal to the lower limit of the corresponding one of the voltage sub-ranges, where $2 \leq m \leq M$, where M is a total number of the voltage sub-ranges, and where the $m^{th}$ one of the voltage sub-ranges is higher than an $(m-1)^{th}$ one of the voltage sub-ranges.

18. The DAC circuit of claim 16, wherein:
for said DAC portion that corresponds to an $m^{th}$ one of the voltage sub-ranges, the respective one of the logic high levels is equal to the upper limit of an $(m+1)^{th}$ one of the voltage sub-ranges, where $1 \leq m \leq M-1$, where M is a total number of the voltage sub-ranges, and where the $m^{th}$ one of the voltage sub-ranges is lower than the $(m+1)^{th}$ one of the voltage sub-ranges.

* * * * *